United States Patent [19]
Sakamoto

[11] Patent Number: 5,168,343
[45] Date of Patent: Dec. 1, 1992

[54] SEMICONDUCTOR INTEGRATED CIRCUIT DEVICE HAVING IMPROVED TRENCH ISOLATION

[75] Inventor: Mitsuru Sakamoto, Tokyo, Japan
[73] Assignee: NEC Corporation, Tokyo, Japan
[21] Appl. No.: 635,688
[22] Filed: Dec. 28, 1990

[30] Foreign Application Priority Data
Dec. 29, 1989 [JP] Japan .................. 1-342841

[51] Int. Cl.$^5$ ............................. H01L 27/12
[52] U.S. Cl. ................... 257/513; 257/647; 257/649
[58] Field of Search .......... 357/49, 54, 47, 50, 357/23.11

[56] References Cited

U.S. PATENT DOCUMENTS

| | | | |
|---|---|---|---|
| 4,549,338 | 10/1985 | Abend et al. | 357/49 X |
| 4,621,414 | 11/1986 | Iranmanesh | 357/49 X |
| 4,727,048 | 2/1988 | Pierce et al. | 357/49 X |
| 4,791,073 | 12/1988 | Nagy et al. | 357/49 X |
| 4,825,277 | 4/1989 | Mattox et al. | 357/49 |
| 4,855,804 | 8/1989 | Bergami et al. | 357/49 |

*Primary Examiner*—William Mintel
*Assistant Examiner*—Roy K. Potter
*Attorney, Agent, or Firm*—Burns, Doane, Swecker & Mathis

[57] ABSTRACT

In a dielectric isolation structure for elements in a semiconductor integrated circuit device, thermal stress and the resistance to hydrofluoric acid have been improved by using silicon boron nitride, silicon oxynitride or silicon nitride as an insulator material in the manner embedded in grooves or trenches formed on a surface of a substrate of the device. Additional merit of reducing parasitic capacitance of the dielectric isolation structure can be obtained by introducing therein a composite layer comprising a layer of porous silicon oxide and a layer of the insulator material as above.

8 Claims, 6 Drawing Sheets

SEMICONDUCTOR INTEGRATED CIRCUIT DEVICE HAVING IMPROVED TRENCH ISOLATION

BACKGROUND OF THE INVENTION

1. Field of the Invention

The present invention relates to a structure of a semiconductor integrated circuit device for dielectric isolation between circuits elements contained in the device, and more particularly to such a structure having grooves or trenches wherein an insulator material is embedded.

2. Description of the Prior Art

Heretofore, it has widely been known for dielectric isolation between circuit elements of a semiconductor integrated circuit device to locally oxidate a silicon substrate of the device. This technique is called local oxidation of silicon (LOCOS). Further, in order to accommodate the requirement of more and more minute structure in the field of semiconductor integrated circuit devices, it has been proposed to modify the LOCOS structure or to form trenches on the semiconductor substrate surface and embed a silicon oxide layer in the trenches.

Now referring to FIG. 9, a currently employed dielectric isolation structure for circuit elements is explained. This FIG. 9 shows a general structure of an N-channel metal-oxide semiconductor field-effect-transistor (MOSFET) by way of a sectional view. On a silicon substrate 91 having a p-type conductivity, a channel stopper region 92 having a $p^+$-type conductivity higher than the impurity concentration in the silicon substrate 91 is provided and on this region, a thick silicon oxide film is formed by a known selective thermal oxidation method using a silicon nitride film as a mask to provide a dielectric isolation film 93 for circuit elements. The channel stopper region 92 and the dielectric isolation film 93 surround the MOSFET to ensure electric isolation from adjacent MOSFETs. This MOSFET is constituted by source/drain regions 94 formed by an $n^+$ layer, a gate insulation film 95, a gate electrode 96 and metal leads 98 as outgoing lines from the source/drain regions formed on an interposed layer-isolation film 97. This device is finally covered with a passivation film 99 for ensuring reliability.

Such a prior art element isolation structure as described above however is not suitable for extremely minute elements in, for example, a very large scale integrated circuit (VLSI). Since thermal oxidation is used to form the dielectric isolation film 93, the oxide film also grows in a lateral direction to form what are called bird's beaks and so it is impractical to effect selective oxidation of minute regions. It has therefore been proposed to form grooves on a silicon substrate surface and embed a silicon oxide film therein, but such technique has not as yet been completed as an industrially employable one.

In effect, when a width of an element isolation region becomes less than 0.5 μm, formation of bird's beaks or crystal defects owing to thermal stress occurs frequently in the prior art LOCOS or modified LOCOS structure and so it is impractical to accommodate to 64M dynamic random access memory (DRAM) class VLSI.

Further, in the prior art technique of forming trenches on a silicon semiconductor substrate surface and embedding a silicon oxide film therein, there is a problem that a large stress of more than $10^9$ dync/cm$^2$ is generated in the silicon substrate and crystal defects are liable to occur in the substrate when the substrate is subjected to a thermal treatment, due to the difference between the thermal expansion coefficients of the silicon oxide film and the substrate. Moreover in this technique, in a process step of hydrofluoric acid treatment which is essential for producing a semiconductor device, a part of the silicon oxide film embedded in the trenches is removed to expose upper corner portions of the trenches and therefore to form channel regions of the MOSFET also on upper inside wall of the trenches. In the channel regions as formed above, a larger amount of current is leaked and so transistor properties are impaired.

SUMMARY OF THE INVENTION

An object of the present invention therefore is to provide a semiconductor integrated circuit device with structure for dielectric isolation between circuit elements contained therein which solves the above problems of thermal stress and resistance to hydrofluoric acid.

Thus the present invention provides a semiconductor integrated circuit device wherein its structure for dielectric isolation between circuit elements comprises (a) grooves formed on a semiconductor substrate surface to extend into the semiconductor substrate and (b) an insulator material selected from a group consisting of silicon boron nitride, silicon oxynitride or silicon nitride, which is embedded in the grooves.

When the insulator material (b) is silicon boron nitride, it becomes possible to appropriately adjust the thermal expansion coefficiency and the hydrofluoric acid resistance of the material by controlling the ratio of silicon and boron. It is also possible to form a film of another insulator material (c) selected from the group consisting of silicon nitride or silicon oxide on the inner surfaces of the grooves so that it is interposed between the inner surfaces of the grooves (a) and the insulator material (b) embedded in the grooves. By this, it becomes possible to reduce current leakage.

When the insulator material (b) is silicon oxynitride or silicon nitride, it becomes possible to appropriately adjust the thermal expansion coefficiency and the hydrofluoric acid resistance of the material by controlling the ratio of oxygen and nitrogen. It is also possible to form a film of silicon oxide (d) on the inner surfaces of the grooves (a) so that it is interposed between the inner surfaces of the grooves (a) and the insulator material (b) embedded in the grooves. By this, it becomes possible to reduce current leakage and stress. Further, it becomes possible to considerably reduce parasitic capacitance of the dielectric isolation region by introducing a composite insulator layer structure comprising a layer of porous silicon oxide (e) embedded in the lower portion of the grooves (a) and the insulator material (b) embedded in the upper portion of the grooves (a).

DESCRIPTION OF THE PREFERRED EMBODIMENTS

The present invention will be explained below in detail with respect to its preferred embodiments.

Figure 1:
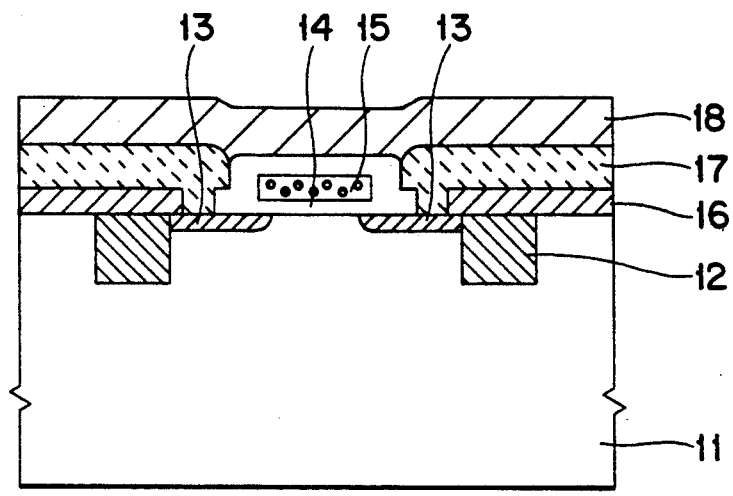
FIG. 1 shows a vertical sectional view of the first embodiment of the semiconductor integrated circuit device of the present invention, illustrating only a MOSFET portion contained therein.

The first embodiment of the present invention is shown in FIG. 1 by way of a vertical sectional view. This embodiment is one that applies the present invention to dielectric isolation between elements of an N channel MOSFET.

On a surface of a p-type silicon substrate 11, trenches are formed by a dry etching method to have a width of not more than 0.5 $\mu$m and a depth of not more than 2 $\mu$m. In such trenches, a silicon boron nitride film 12 is embedded by a method as explained hereinafter, to form a dielectric isolation region so that it may surround a MOSFET to be formed by subsequent process steps. The formation of the MOSFET by itself is carried out by in a conventional manner so that the MOSFET may be constituted by source/drain regions 13, a gate isolation film 14, a gate electrode 15, a layer isolation film 16, metal leads 17 for outgoing from the source/drain and a passivation film 18.

By controlling the composition of the silicon boron nitride film, that is, the ratio of silicon and boron, it becomes possible to variously change a specific inductive capacity ($\epsilon$), a resistance to hydrofluoric acid and a thermal expansion coefficiency of the film. Details of the formation of the silicon boron nitride film will be explained hereinafter.

Figure 2:
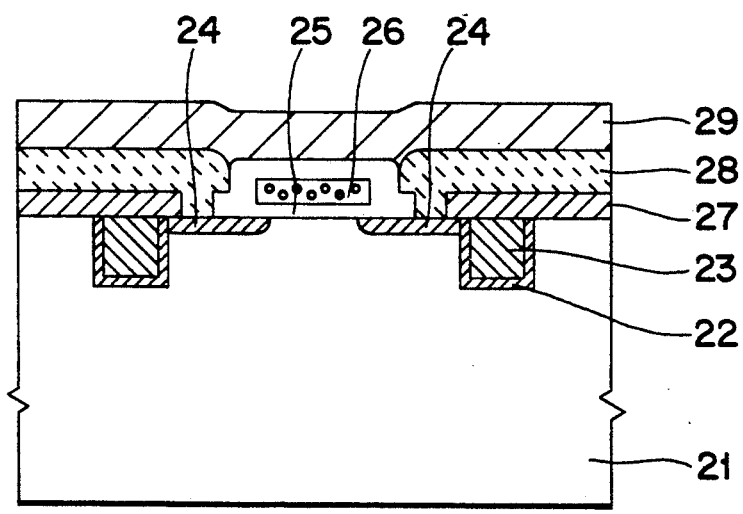
FIG. 2 shows a vertical sectional view of the second embodiment of the device of the present invention in the manner similar to FIG. 1.
Figure 3A:
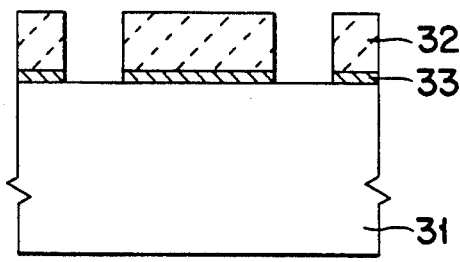
FIG. 3 shows a schematic view of process steps (a) to (b) for producing the third embodiment of the device of the present invention.
Figure 3E:
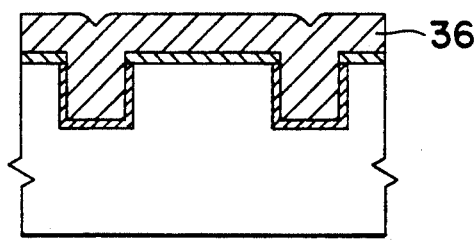
Figure 3B:
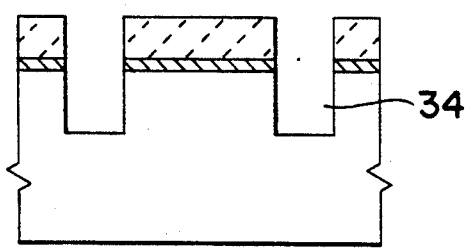
Figure 3F:
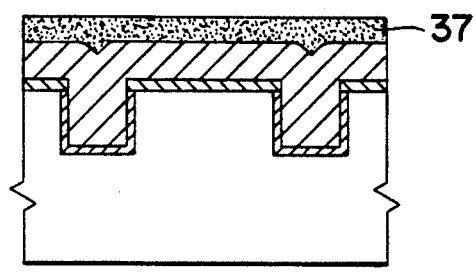
Figure 3C:
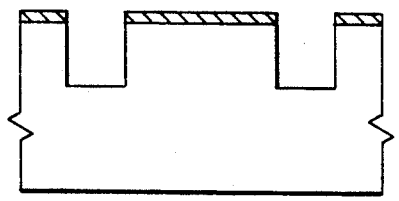
Figure 3G:
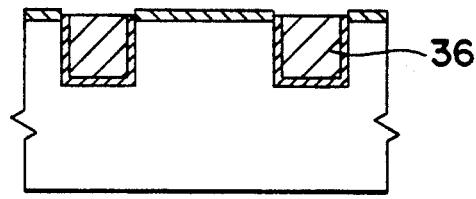
Figure 3D:
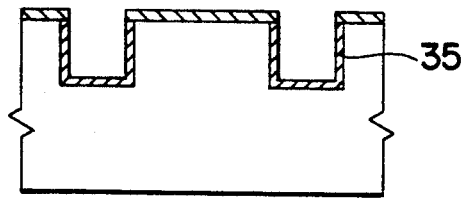
Figure 3H:
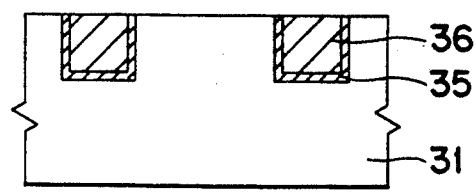

The second embodiment of the present invention is shown in FIG. 2 by way of a vertical sectional view. This second embodiment is different from the first embodiment only at the point that a silicon boron nitride film 23 is embedded in trenches after another insulator film 22 is formed on the inside surfaces of the trenches beforehand, by for example forming a thin silicon oxide film of not more than 1,000 Å by a thermal oxidation method or forming a thin silicon nitride film of not more than 100 Å by a thermal treatment in a plasma gas atmosphere containing ammonia gas and nitrogen gas. The other structures 24-29 are the same as structures 13-18, respectively, in the first embodiment.

In this second embodiment, it is possible to avoid direct contact between the silicon boron nitride film 23 in the trenches and the p-type silicon substrate 21 as in the first embodiment and so it becomes possible to avoid an increase of interfacial potential density. Thus, it becomes possible to reduce leakage current through the interfacial potential to obtain a highly reliable dielectric isolation structure in an easy manner.

Next, a process for the production of the third embodiment of the present invention is explained in detail with reference to FIG. 3, wherein (a) to (h) correspond to process steps (a) to (h) and show vertical sectional views of the device produced in the process steps respectively.

In a process step (a), a patterned silicon oxide film 33 is formed on a surface of a p-type silicon substrate 31 by an etching method using a resist mask 32 formed by a known lithography technique.

Subsequently in a step (b), trenches 34 are formed by dry etching using the resist mask 32 and the patterned silicon oxide film 33 as etching masks. Next the resist mask 32 is removed in an oxygen plasma and the device is washed in a step (c).

Then an auxiliary insulator film 35 (corresponding to "another" insulator film 22 in the second embodiment) is formed in a step (d), by for example forming a thin silicon oxide film of 100 Å on the inside surfaces of the trenches by thermal oxidation in a high temperature furnace at for example 900° C. of oxygen atmospheric gas or forming a thin silicon nitride film of 50 Å on the inside surfaces of the trenches by a thermal treatment in plasma gas atmosphere containing ammonia gas or nitrogen.

In the next stop (c), a silicon boron nitride layer 36 is deposited on the entire surface of the p-type silicon substrate 31. The deposition of the silicon boron nitride layer 36 is carried out in a plasma CVD furnace wherein monosilane, diborane, ammonia, argon, etc. are introduced in a gaseous state as reactive gases and brought into a plasma state, at a substrate temperature of 300°-800° C. On the other hand, organic source reactive gases such as tetramethylsilane or trimethylboron may be used in a similar manner. In the formation of the silicon boron nitride layer 36, it is effective to control the composition to have a nitrogen content of 40-50%, a boron content of 20-40% and a silicon content of 10-40%. As the boron content increases, the specific inductive capacity of the layer decreases and the resistance to hydrofluoric acid increases, but the moisture resistance decreases. Therefore, the maximum boron content is materially limited and so it is preferable to employ 20-30% boron content. In this case, the silicon content preferably is 20-30%.

After the silicon boron nitride layer has been deposited and embedded in the trenches, a flattening layer 37 is formed by coating an organic high polymer film of such as a photoresist, in a step (f).

Then the flattening layer 37 and a part of the silicon boron nitride layer 36 are removed by entire etch back by dry etching in a $CF_4/O_2$ mixed gas, in step (g). In this step (g), the patterned silicon oxide film 33 works as a buffer when the silicon boron nitride layer 36 is etched back. Conditions for the etch back are arranged so that the silicon boron nitride layer 36 and the flattening layer 37 may have approximately same etching rates.

Finally in a step (h), the patterned silicon oxide film 33 is removed in a buffered hydrofluoric acid to obtain a dielectric isolation structure comprising the trenches and the silicon boron nitride layer 36 embedded in the trenches. In the dielectric isolation region thus obtained, a MOSFET is formed in a known manner to form a semiconductor device as shown in FIG. 4.

Figure 4:
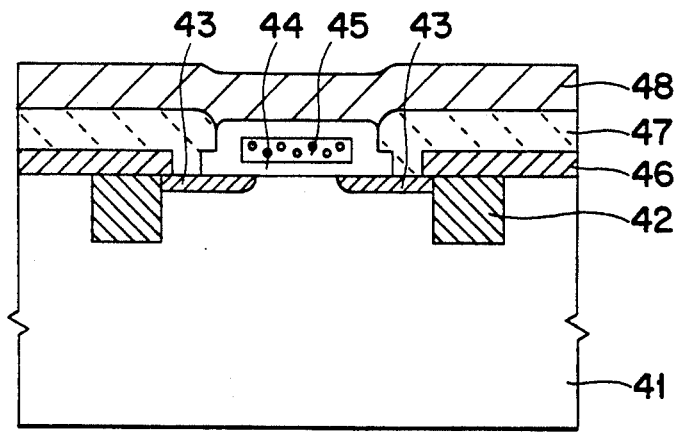
FIGS. 4-6 show vertical sectional views respectively of the fourth, fifth and sixth embodiments of the device of the present invention in the manner similar to FIG. 1.

The fourth embodiment of the present invention is shown in FIG. 4 by way of a vertical sectional view. This embodiment also is one that applies the present invention to dielectric isolation between elements of an N channel MOSFET.

On a surface of a p-type silicon substrate 41, trenches are formed by a dry etching method to have a width of not more than 0.5 $\mu$m and a depth of not more than 2

μm. In such trenches, a silicon oxynitride film 42 is embedded by a method as explained hereinafter, to form a dielectric isolation region so that it may surround a MOSFET to be formed by subsequent process steps. The formation of the MOSFET itself is carried out in a conventional manner so that the MOSFET may be constituted by source/drain regions 43, a gate isolation film 44, a gate electrode 45, a layer isolation film 46, metal leads 47 for outgoing from the source/drain and a passivation film 48.

By controlling the composition of the silicon oxynitride film, that is, the ratio of oxygen and nitrogen it becomes possible to vary a resistance to hydrofluoric acid and a thermal expansion coefficient of the film. More particularly, it becomes possible to control the film stress to an extent of $10^8$ dyno/cm$^2$ and so to restrain induction of crystal defects in the silicon substrate.

Figure 5:
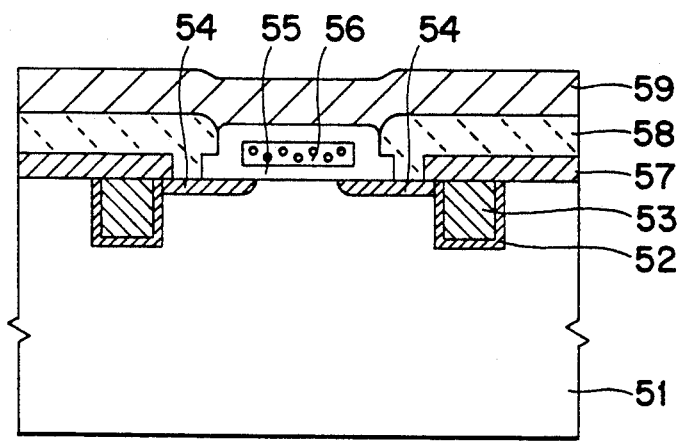

The fifth embodiment of the present invention is shown in FIG. 5 by way of a vertical sectional view. This fifth embodiment is different from the fourth embodiment only at the point that a silicon oxynitride film 53 is embedded in trenches after another insulator film 52 is formed on the inside surfaces of the trenches beforehand, by, for example, forming a thin silicon oxide or silicon nitride film of not more than 1,000 Å by a thermal treatment. The other structures 51, 54–59 are same as structures 41, 43–48, respectively, in the fourth embodiment.

In this fifth embodiment, when the silicon oxide film is used as the another insulator film 52, it becomes possible to increase a nitrogen content in the silicon oxynitride film in comparison with the fourth embodiment, that is, nearly to or same as the nitrogen content of silicon nitride. Thus, it becomes possible to easily restrain loss of the film in the hydrofluoric acid treatment step in a semiconductor device production process. In general a silicon oxide film and a silicon nitride film are liable to give compression stress and tensile stress, respectively, and so it becomes possible to cancel these stresses with each other by combining them to form a two-layer structure. Further, the solubility in hydrofluoric acid of silicon oxynitride is decreased as its nitrogen content is increased nearly to silicon nitride.

Figure 6:
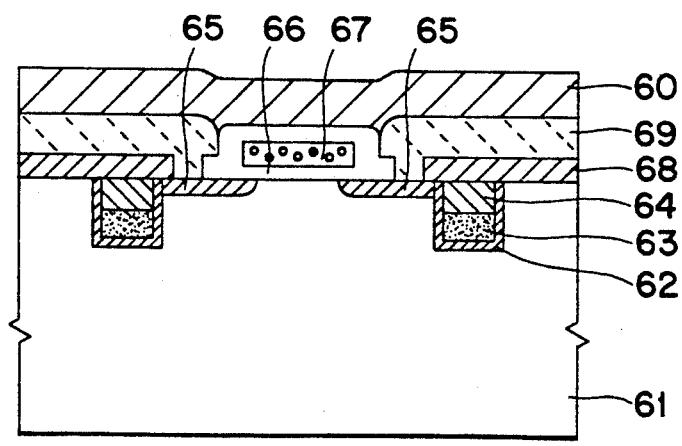
Figure 7A:
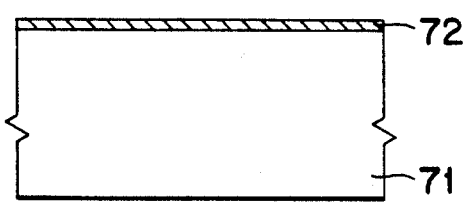
FIGS. 7(a-h) and 8(a-h) shows schematic views of process steps (a) to (h) for producing respectively the seventh and eighth embodiments of the device of the present invention in the manner similar to FIG. 3.
Figure 7E:
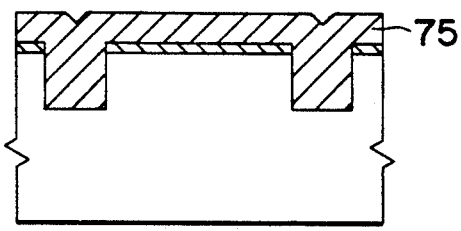
Figure 7B:
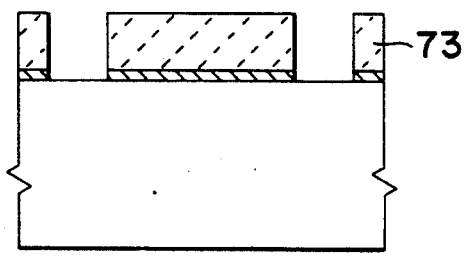
Figure 7F:
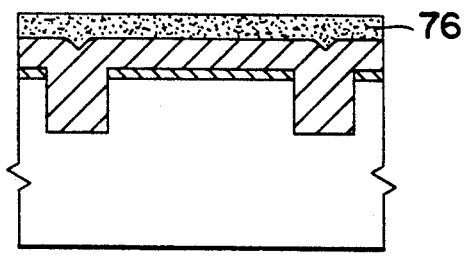
Figure 7C:
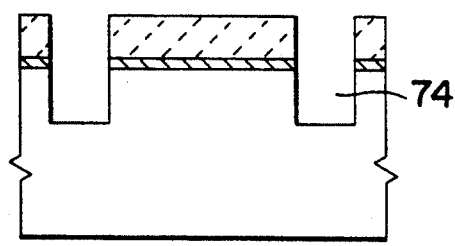
Figure 7G:
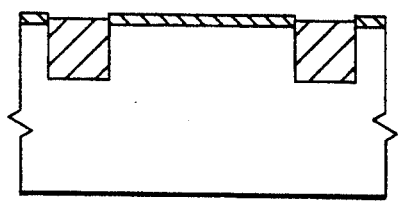
Figure 7D:
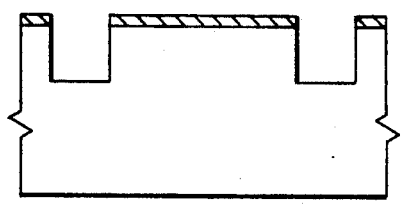
Figure 7H:
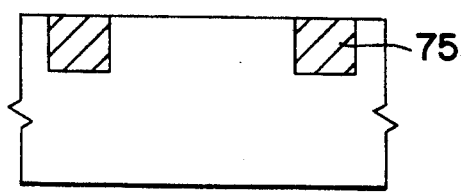
Figure 8A:
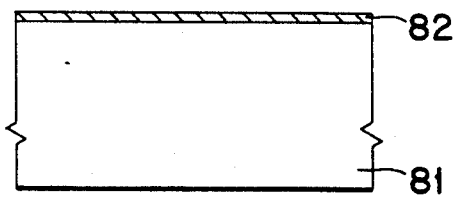
Figure 8B:
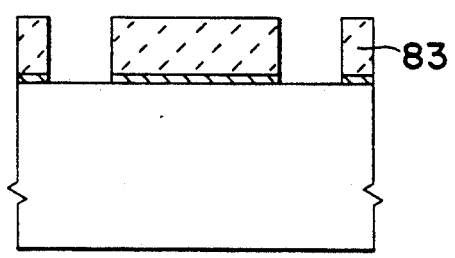
Figure 8C:
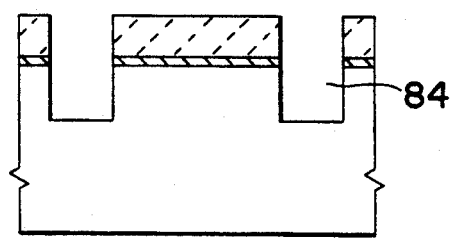
Figure 8D:
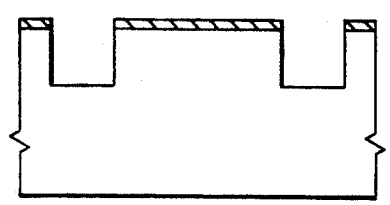
Figure 8E:
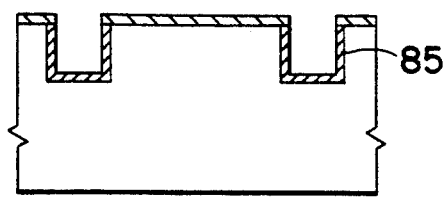
Figure 8F:
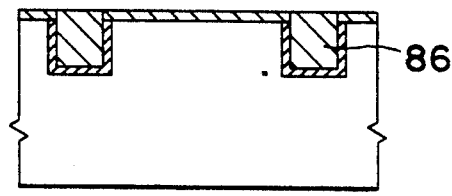
Figure 8G:
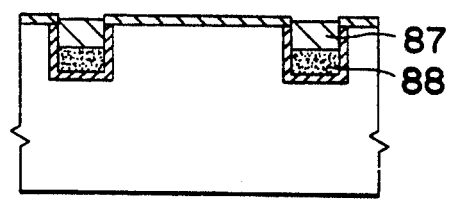
Figure 8H:
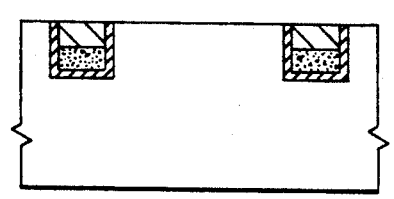
Figure 9:
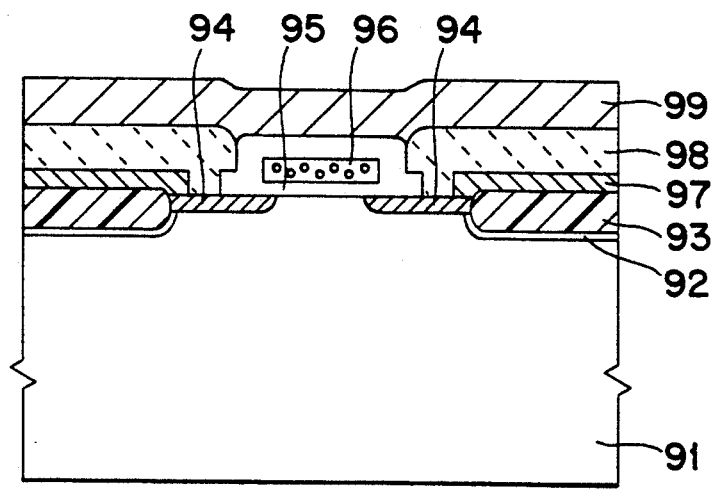
FIG. 9 shows a vertical sectional view of a prior art semiconductor integrated circuit device in the manner similar to FIG. 1.

The sixth embodiment of the present invention is shown in FIG. 6 by way of a vertical sectional view. This sixth embodiment is different from the fifth embodiment only at the point that after another insulator film 62 is formed on the inside surfaces of trenches formed on the surface of a p-type silicon substrate 61, two layers of different insulator materials comprising a porous silicon oxide film 63 in the lower portion of the trenches and a silicon oxynitride film 62 in the upper portion of the trenches are embedded in the trenches. The other structures 64–69 and 60 are the same as structures 53–59, respectively, in the fifth embodiment.

The specific inductive capacity ($\epsilon$) of the silicon oxynitride film to be embedded in the trenches may be variously changed within a range of from $\epsilon = 3.9$ of silicon oxide film to $\epsilon = 7.4$ of silicon nitride film in accordance with its composition. In any event, $\epsilon$ of the silicon oxynitride film becomes larger than that of the silicon oxide film. On the other hand, $\epsilon$ of the porous silicon oxide film can be decreased to not more than 2. It is therefore possible in this sixth embodiment to considerably reduce parasitic capacitance in the dielectric isolation region due to the composite layer comprising the silicon oxynitride film and the porous silicon oxide film, in contrast to the fourth and the fifth embodiments wherein the parasitic capacitance in the dielectric isolation region is increased in comparison with the prior art silicon oxide film embedding technique.

Next, a process for the production of the seventh embodiment of the present invention is explained in detail with reference to FIG. 7, wherein (a) to (h) correspond to process steps (a) to (h) and show vertical sectional views of the device produced in the process steps respectively.

In a process step (a), silicon oxide film 72 having a thickness of 2,000 Å is formed on a surface of a p-type silicon substrate 71 by thermal oxidation in an oxygen atmosphere.

Then in a step (b), a resist mask 73 is formed by a known lithography technique and the silicon oxide film 72 is dry etched.

Subsequently in a step (c), trenches 74 are formed by dry etching by using the resist mask 73 as an etching mask.

Next the resist mask 73 is removed in an oxygen plasma in a step (d).

In the next step (e), a silicon oxynitride layer 75 is deposited on the entire surface of the p-type silicon substrate 71. The deposition of the silicon oxynitride layer 75 is carried out by a plasma CVD method in gas plasma of SiH$_4$, NH$_3$ and N$_2$O or by a thermal CVD method in tetraethoxysilane and excited NH$_3$ gas. In the formation of the silicon oxynitride layer 75, it is effective to control the composition to have a silicon content of 40–50%, a nitrogen content of 30–40% and an oxygen content of 10–30%, for reducing film stress and enhancing resistance to hydrofluoric acid.

Then, after a thermal treatment in a furnace under thermal oxidation atmosphere for improving an interface between the inner surfaces of the trenches and the silicon oxynitride film, a flattening layer 76 is formed by coating an organic high polymer film of such as a photoresist, in a step (f).

Then the flattening layer 76 and a part of the silicon oxynitride layer 75 are removed by entire etch back by dry etching in a CF$_4$/O$_2$ mixed gas, in a step (g). In this step (g), the silicon oxide film, 72 works as a buffer when the silicon oxynitride layer 75 is etched back. Conditions for the etch back are arranged so that the silicon oxynitride layer 75 and the flattening layer 76 may have approximately same etching rates.

Finally in a step (h), the silicon oxide film 72 is removed in a buffered hydrofluoric acid to obtain a dielectric isolation structure comprising the trenches and the silicon oxynitride layer 75 embedded in the trenches. In the dielectric isolation region thus obtained, MOSFET is formed in a known manner to form a semiconductor device as shown in FIG. 4.

Next, a process for the production of the eighth embodiment of the present invention is explained in detail with reference to FIG. 8, wherein (a) to (h) correspond to process steps (a) to (h) and show vertical sectional views of the device produced in the process steps respectively.

Since the process steps (a) to (d) are same as those of the seventh embodiment, explanation is omitted here to avoid repetition.

After the step (d), the device is washed and then an auxiliary insulator film 85 (corresponding to "another" insulator film 22 in the second embodiment) is formed in a step (e), by for example, forming thin silicon oxide film of 100 Å on the inside surfaces of the trenches by thermal oxidation in a high temperature furnace of oxygen atmospheric gas or forming a thin silicon nitride film of 50 Å on the inside surfaces of the trenches by a thermal treatment in plasma gas atmosphere containing ammonia gas or nitrogen.

In the next step (f), an organic silica layer 86 is formed by coating. It is effective to carry out the formation of the organic silica layer 86 by repeating coating and baking at 400° C. in turn.

Next, a high temperature treatment for, example at 900° C., is carried out in an active gas atmosphere containing nitrogen such as $NH_3$ gas or $NH_2$ gas, whereby the upper portion of the organic silica layer 86 is converted to a silicon oxynitride layer 87 and the lower portion of the organic silica layer 86 is converted to a porous silicon oxide film 88. The reason why the porous silicon oxide film 88 is formed is that in the original organic silica layer, not only Si—O bond but also Si—$CH_3$ bond and O—$CH_3$ bond are contained and so in the thermal treatment at 900° C., $CH_3$ residue goes out of the layer. When the organic silica contains $CH_3$ to an extent of 40% by weight, a porous film having good properties is obtainable. The silicon oxynitride film 87 is formed for the reason that $CH_3$ residue goes out of the layer and in its place $NH_3$ or $NH_2$ gas comes into the layer to bond to the silicon. Therefore, formation rate of the silicon oxynitride layer is controlled by diffusion rate of the nitrogenous gas into the silicon oxynitride layer.

As explained above, the thermal stress and the resistance to hydrofluoric acid of a dielectric isolation structure in a semiconductor integrated circuit device have been improved by the present invention by using silicon boron nitride, silicon oxynitride or silicon nitride as an insulator material to be embedded in trenches.

I claim:

1. A semiconductor integrated circuit device having a structure for dielectric isolation between circuit elements which comprises (a) grooves formed on a semiconductor substrate surface to extend into the semiconductor substrate and (b) a first insulator material comprising silicon boron nitride, which is embedded in the grooves.

2. The semiconductor integrated circuit device according to claim 1, wherein a film of a second insulator material selected from the group consisting of silicon nitride and silicon oxide is formed on inner surfaces of the grooves so that the second insulator material is interposed between the inner surfaces of the grooves and the first insulator material embedded in the grooves.

3. The semiconductor integrated circuit device according to claim 2, wherein the second interposed insulator material film is formed to have a thickness of not more than 1,000 Å.

4. The semiconductor integrated circuit device according to claim 3, wherein the second interposed insulator material film comprises silicon nitride and has a thickness of 50 Å.

5. The semiconductor integrated circuit device according to claim 3, wherein the second interposed insulator material film comprises silicon oxide and has a thickness of 100 Å.

6. The semiconductor integrated circuit device according to claim 1, wherein the silicon boron nitride has a composition of nitrogen content of 40-50%, a boron content of 20-40% and a silicon content of 10-40%.

7. The semiconductor integrated circuit device according to claim 1, wherein the grooves have a width of not more than 0.5 μm and a depth of not more than 2 μm.

8. A semiconductor integrated circuit device having a structure for dielectric isolation between circuit elements which comprises (a) grooves formed on a semiconductor substrate surface to extend into the semiconductor substrate, (b) a layer of porous silicon oxide embedded in the lower portion of the grooves and (c) a layer of an insulator material comprising silicon boron nitride embedded in the upper portion of the grooves to form a composite insulator layer in the grooves together with the layer of porous silicon oxide.

* * * * *